United States Patent
Ceballos

(10) Patent No.: US 7,791,516 B2
(45) Date of Patent: Sep. 7, 2010

(54) TEMPERATURE COMPENSATED DELTA-SIGMA MODULATORS WITH LOGARITHMIC DYNAMIC RANGE

(75) Inventor: Jose Luis Ceballos, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/254,700

(22) Filed: Oct. 20, 2008

(65) Prior Publication Data

US 2010/0097255 A1    Apr. 22, 2010

(51) Int. Cl.
 *H03M 3/00*    (2006.01)
(52) U.S. Cl. ............... 341/143; 341/144; 341/155
(58) Field of Classification Search ............ 341/143, 341/144, 155; 327/176
See application file for complete search history.

(56) References Cited

U.S. PATENT DOCUMENTS

| | | | | | |
|---|---|---|---|---|---|
| 5,959,562 | A | * | 9/1999 | Wiesbauer | 341/143 |
| 6,133,776 | A | * | 10/2000 | Yunus | 327/361 |
| 7,183,955 | B1 | * | 2/2007 | Shih | 341/143 |
| 7,193,546 | B1 | * | 3/2007 | Melanson | 341/143 |
| 7,397,291 | B1 | * | 7/2008 | Parkes et al. | 327/176 |
| 2008/0284635 | A1 | * | 11/2008 | Blatz et al. | 341/158 |

* cited by examiner

*Primary Examiner*—Jean B Jeanglaude
(74) *Attorney, Agent, or Firm*—Lee & Hayes, PLLC

(57) ABSTRACT

A delta sigma (ΔΣ or DS) modulator includes at least a first proportional to absolute temperature (PTAT) element that conditions an input signal, and a second PTAT element that conditions a reference signal.

19 Claims, 5 Drawing Sheets

TEMPERATURE COMPENSATED DELTA-SIGMA MODULATORS WITH LOGARITHMIC DYNAMIC RANGE

BACKGROUND

Delta sigma (ΔΣ or DS) modulation is a type of analog-to-digital (ADC) or digital-to-analog (DAC) conversion. The principle of ΔΣ modulation is typically to make evaluations of the input signal, to measure any error, integrate the error signal and then filter out out-of-band quantization or noise. Some ΔΣ modulators convert an analog input signal to a digital pulse string having an average amplitude over time proportional to the analog input. ΔΣ modulation provides for high accuracy and wide dynamic range as compared to other delta modulation techniques. ΔΣ modulation is sometimes referred to as an oversampled converter architecture which is immune from some undesirable second order effects of delta modulation.

A ΔΣ modulator generally comprises one or more integrators for an input signal, which are fed into a quantizer, the output of which is the output of the ΔΣ quantizer. The output is also fed through a digital to analog converter (DAC) in a feedback loop to the integrators.

As with many electronic circuits and components, the behavior of ΔΣ modulators may be sensitive to variations in temperature. Semiconductor and other materials have an inherent internal resistance and generate heat. This resistance is also subject to change with temperature, and may actually cause some internal heating in some applications.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Described herein are exemplary techniques for producing a relatively temperature independent delta-sigma (ΔΣ or DS) modulator. An input signal received by a ΔΣ modulator is processed by a proportional to absolute temperature (PTAT) conditioner. The ΔΣ modulator is capable of accepting a variable or dynamic logarithmic input signal. A reference signal is formed by being subject to a feedback loop of the ΔΣ modulator by passing various elements including another PTAT. The two signals—the input and the reference—have the same temperature dependence and cancel each other out with respect to temperature changes with the result that the physical output signal remains at approximately the same level irrespective of the temperature of circuit components over a reasonable temperature range.

The input signal and reference signal are summed together; the resulting combined signal is treated by a loop filter before being subjected to a quantizer. As part of the feedback loop, after the quantizer, the combined signal is processed by a digital-to-analog converter (DAC). Outside of the feedback loop, the combined output signal from the quantizer is subjected to a look-up table and/or further digital signal processing to produce a linearized output signal.

The techniques described herein may be implemented in a number of ways. One example environment and context is provided below with reference to the included figures.

Exemplary Systems

Figure 1:
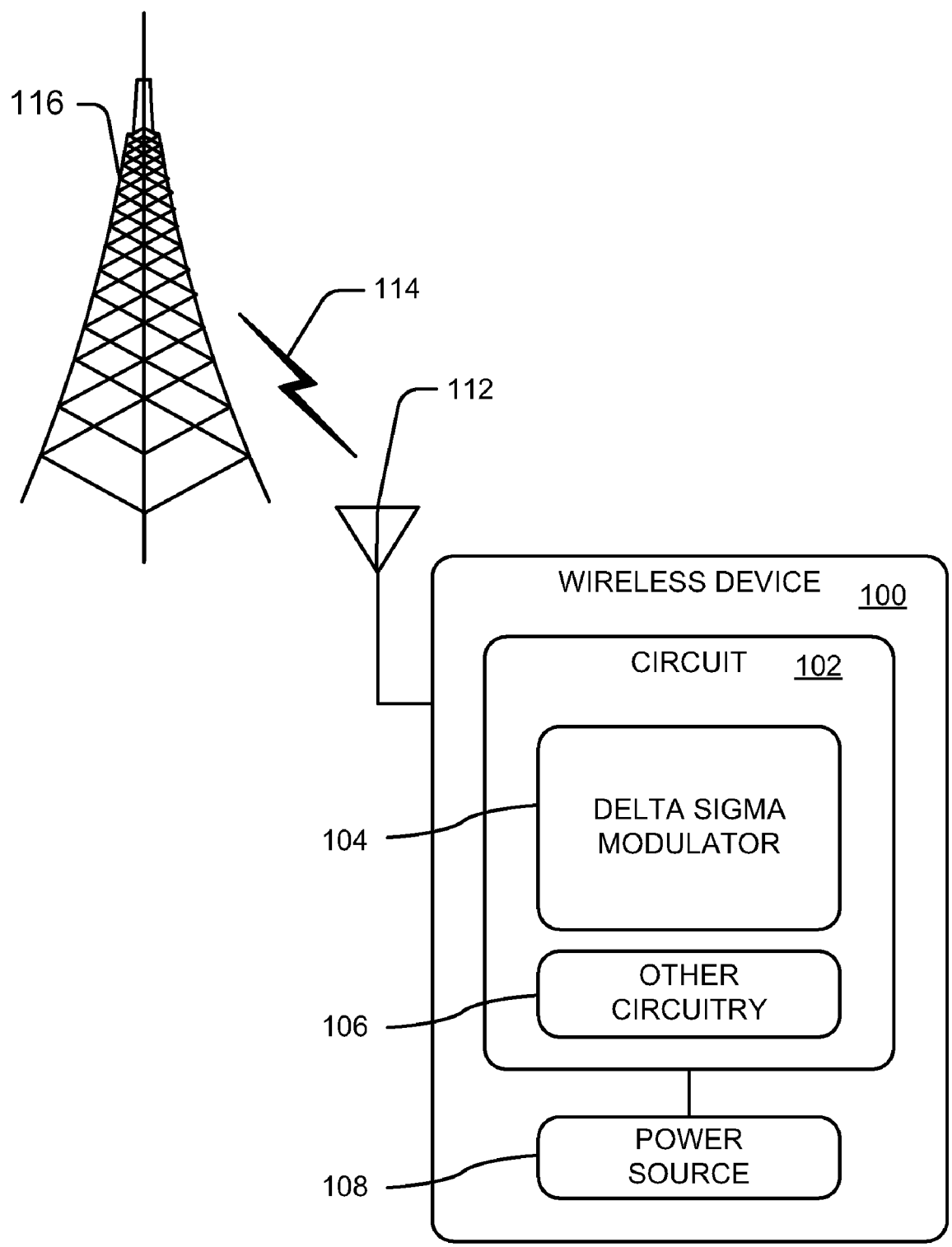
FIG. 1 is diagram depicting a wireless apparatus including a delta sigma modulator such as the one shown in FIG. 2.

FIG. 1 is a diagram depicting a wireless device (i.e., apparatus) 100 wherein a ΔΣ modulator 104 as described herein may be employed. For purposes of non-limiting example, the wireless device 100 is presumed to include various resources that are not specifically depicted in the interest of clarity. The wireless device 100 is further presumed to be configured to perform in one or more wireless operating modes (e.g., mobile cellular communications, global positioning system (GPS) reception).

The wireless device 100 includes a circuit 102. The circuit 102 includes, among other possible features, a ΔΣ modulator 104. The circuit 102 further includes other circuitry 106 which may be necessary or desirable. The other circuitry enables features or functions of a wireless device 100 including a ΔΣ modulator 104 as described herein. The other circuitry 106 may or may not be located on the same circuit board.

The wireless device 100 further includes a source of electrical energy or power source 108. In one or more implementations, the power source 108 is defined by one or more batteries. In other implementations, the power source 108 may be defined by an inductively coupled power supply that is energized by an electromagnetic illumination field provided by some entity external to the wireless device 100. Other types of power source 108 may also be used. In any case, the power source 108 is coupled so as to provide electrical energy to the circuit 102. In this way, the wireless device 100 is presumed to be operable in a portable manner.

The wireless device 100 further includes an antenna 112. The wireless device 100 is presumed to operate by way of wireless signals 114 between the antenna 112 and a wireless network 116. A single cellular tower is depicted in the interest of simplicity to represent the wireless network 116. However, it is to be understood that other resources (not shown) of a corresponding wireless network are also present and operative as needed so as to enable the wireless device 100 to perform its various functions (cellular communications, Internet access, etc.). The wireless device 100 is a general and non-limiting example of countless devices and systems that may be configured and operated in accordance with the description, means and techniques found herein.

Figure 2:
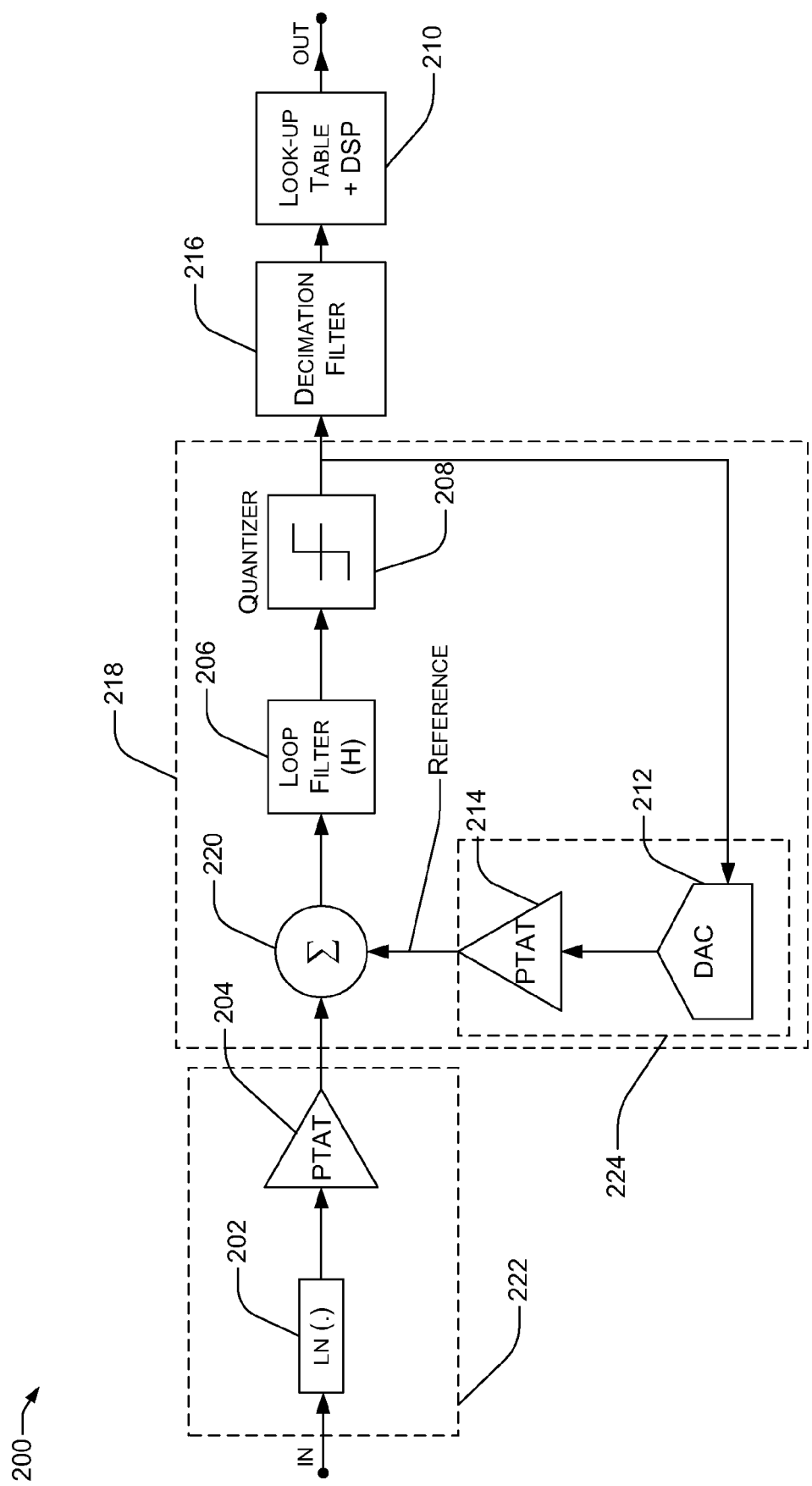
FIG. 2 is a diagram showing the main loop of one implementation of a delta sigma modulator with temperature compensating elements.

FIG. 2 illustrates one implementation of a ΔΣ modulator 200 with temperature compensating elements. With reference to FIG. 2, a logarithmic element 202 receives an input signal to the ΔΣ modulator 200; the input is labeled "IN." A first proportional to absolute temperature (PTAT) element 204 is placed between a logarithmic element 202 and the summation point 220. Together, the logarithmic element 202 and the first PTAT element 204 make up a logarithmic circuit 222. The PTAT element 204 can be considered a signal, voltage or current conditioner.

A signal output from the first PTAT 204 is combined at the summer 220 with a reference signal output from a reference circuit 224. The reference circuit 224 comprises a DAC 212 coupled to a second PTAT 214.

The combined signal, which is received by a loop filter 206, is relatively temperature insensitive because the effect of temperature on the input signal, after it passes through the first PTAT 204, is canceled by treating the reference signal with the second PTAT 214. In effect, the signal output from the logarithmic circuit 222 and the reference signal from the reference circuit 224 have the same temperature dependence and a signal output from the ΔΣ modulator 200 remains at the same voltage level over variations in temperature. The first PTAT 204 may be chosen to have the same, similar or different characteristics as those of the second PTAT 214 depending on what is desired.

An output signal of the loop filter 206 is processed by a quantizer 208. A signal output by the quantizer 208 is received by a decimation filter 216. An output of the decimation filter 216 is subjected to a look-up table 210 and is treated to further digital signal processing (DSP) as desired before being considered an output of the ΔΣ modulator 200. The output of the ΔΣ modulator 200 is labeled "OUT" in FIG. 2.

The ΔΣ modulator 200 includes a feedback loop 218 which includes the reference circuit 224. The signal output from the quantizer 208 is also fed through a DAC 212, via the feedback loop 218, before being subjected to the second PTAT 214. In this implementation, the summer 220 is time sampled analog, such as by switched capacitor circuits. Other implementations that do not use switched capacitor circuits are possible.

In terms of computation, for a single bit system, and contemplating a linear model, the gain of the first PTAT 204 and the gain of the second PTAT 214 can be placed inside of the loop filter 206 and then translated by the quantizer 208. The effect is that the temperature dependence of the input "IN" is canceled.

For a multi-bit system, the gain change in the loop can cause instability. The loop filter 206 must be robust enough to tolerate such variations as gain change. However, in band, the system is somewhat well-behaved since computationally KH/(1+KH) is approximately equal to one, where K is the change in the loop gain.

Any configuration and variation of ΔΣ modulators is considered within the scope of this disclosure. The ΔΣ modulator 200 may be included in a wireless communication device to provide a ΔΣ modulation function or capability.

Figure 3:
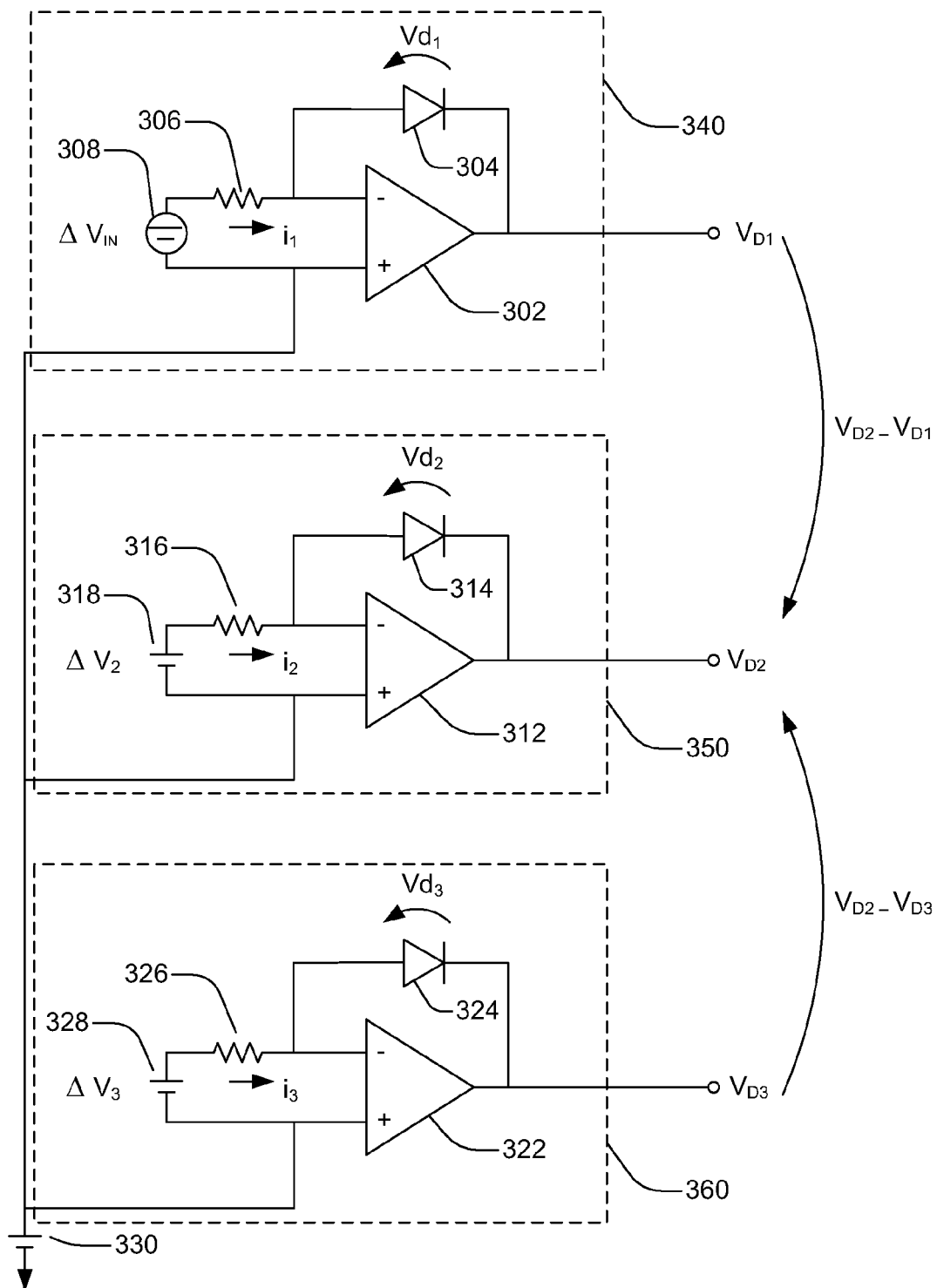
FIG. 3 is a simplified schematic diagram showing one implementation to obtain the input for the reference signal prior to it being subject to the summation element shown in FIG. 2.

FIG. 3 shows an exemplary implementation according to which the input signal and the reference signal as described in FIG. 2 may be obtained in practice. As one of skill in the art will appreciate, implementations other than the one shown in FIG. 3 may be used to acquire the input signal and reference signal. With reference to FIG. 3, three log amplifiers 340, 350, 360 are used. An input voltage 308 or $\Delta V_{IN}$ is applied to the first log amplifier 340. The first log amplifier 340 is made up of a first op amp 302, a first resistor 306, and a first diode 304. Similarly, a second voltage 318 or $\Delta V_2$ is applied to the second log amplifier 350. The second log amplifier 350 is made up of a second op amp 312, a second resistor 316, and a second diode 314. Finally, a third voltage 328 or $\Delta V_3$ is applied to the third log amplifier 360, which is made up of a third op amp 322, a third resistor 326, and a third diode 304.

The difference between an output voltage of the first log amp 340, $V_{D1}$, and an output voltage of the second log amp 350, $V_{D2}$, is the input voltage to a ΔΣ modulator such as the ΔΣ modulator 200 shown in FIG. 2. The difference between the output voltage of the second log amp 350, $V_{D2}$, and the output voltage of the third log amp 360, $V_{D3}$, is the reference voltage to the ΔΣ modulator.

In circuit shown in FIG. 3, $\Delta V_{in}$ is positive and the following relationship holds: $\Delta V_3 \geq \Delta V_{in} \geq \Delta V_2^2/\Delta V_3$. The current across each of the resistors 306, 316, 326 is expressed in Equations 1-3, respectively.

$$i_1 = \Delta V_{in}/R = I_s e^{V_{d1}/V_T} \quad (1)$$

$$i_2 = \Delta V_2/R = I_s e^{V_{d2}/V_T} \quad (2)$$

$$i_3 = \Delta V_3/R = I_s e^{V_{d3}/V_T} \quad (3)$$

Equations 1-3 lead to the following equations for input voltage and reference voltage, respectively:

$$\text{(input)} \; V_{02} - V_{01} = V_{d1} - V_{d2} = V_T \ln(i_1/i_2) = V_T \ln(\Delta V_{in}/\Delta V_2) \quad (4)$$

$$\text{(reference)} \; V_{02} - V_{03} = V_{d3} - V_{d2} = V_T \ln(i_3/i_2) = V_T \ln(\Delta V_3/\Delta V_2) \quad (5)$$

For a single-bit DAC, the following relations are true for the upper and lower limits of the input voltage, respectively:

$$\text{(upper limit)} \; +V_{REF} = V_T \ln(\Delta V_3/\Delta V_2) \quad (6)$$

$$\text{(lower limit)} \; -V_{REF} = -V_T \ln(\Delta V_3/\Delta V_2) \quad (7)$$

The maximum input voltage positive swing can be expressed as follows:

$$V_T \ln(\Delta V_{in}/\Delta V_2) \leq V_T \ln(\Delta V_3/\Delta V_2) \quad (8)$$

Equation 8 leads to the following assignment for the upper bound of the input voltage:

$$\text{(upper limit)} \; \Delta V_{in} = \Delta V_3 \quad (9)$$

As for the lower bounds of the input voltage, the following relationship is true:

$$-V_T \ln(\Delta V_3/\Delta V_2) = V_T \ln(\Delta V_{in}/\Delta V_2) \quad (10)$$

Equation 10 leads to the following assignment for the lower bound of the input voltage:

$$\Delta V_{in} = \Delta V_2^2/\Delta V_3 \quad (11)$$

Thus, the input voltage will be between $\Delta V_2^2/\Delta V_3$ and $\Delta V_3$. For example, where $\Delta V_3$ is 1 and $\Delta V_2$ is 0.01, the range for the input voltage is between 0.0001 and 1.0 volts.

Figure 4:
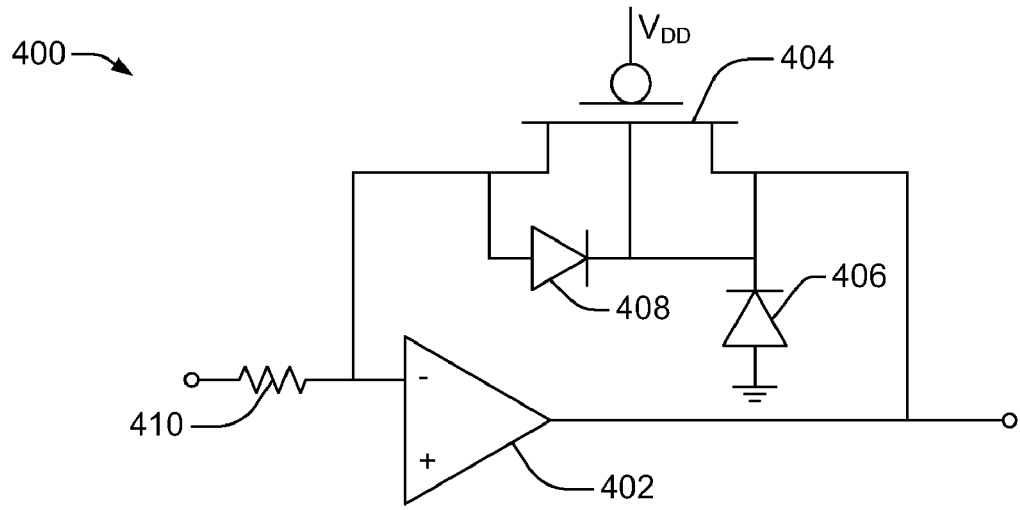
FIG. 4 is a schematic diagram showing an alternative implementation to obtain the input of the reference to the summation element shown in FIG. 2.

FIG. 4 illustrates a circuit in which the exemplary circuit shown in FIG. 3 may be implemented. With reference to FIG. 4, the circuit is made up of components operating as an op amp 402, a PMOS transistor 404, a first well-bulk parasitic diode 406, a second well-diffusion parasitic diode 408, and a resistor 410.

There is an offset effect which should be taken into account when working with a ΔΣ modulator and the associated elements described herein.

Figure 5:
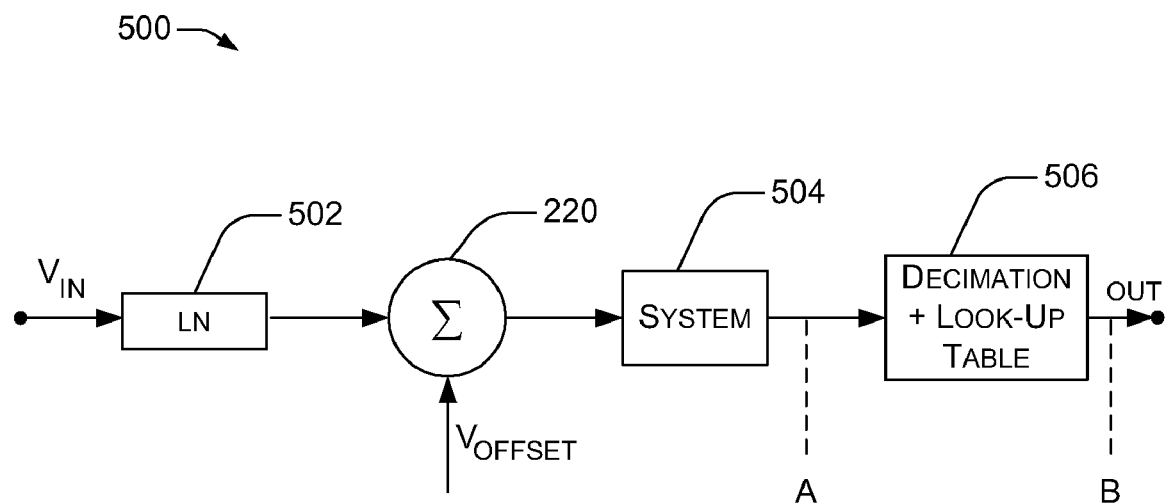
FIG. 5 is a diagram showing where the offset voltage enters a summation element as part of a delta sigma modulator.

FIG. 5 shows where an offset voltage enters the system. With reference to FIG. 5, the input voltage, $V_{in}$, is passed into a logarithmic circuit or element 502 and a summation element 220 in sequence. The summation element 220 also receives a reference voltage or reference signal which is also an offset voltage, $V_{offset}$. The resultant signal or voltage is next subjected to a system element 504 which is at least a loop filter and quantizer (not shown). At point A, after the system element 504, the voltage or signal is proportional to the log of the input voltage plus the offset voltage or $\text{Ln}(V_{in}) + V_{offset}$.

If the decimation and look-up table 506 is an exponential function such as $e^x$, then the voltage or signal at point B is proportional to the product of the input voltage and the exponential of the offset voltage. The voltage at point B in FIG. 5 can be expressed as follows in Equation 12:

$$V_B \propto V_{in} \cdot e^{V_{off}} \qquad (12)$$

At point B, as shown in Equation 12, the offset effectively introduces a gain error that must be compensated.

Figure 6:
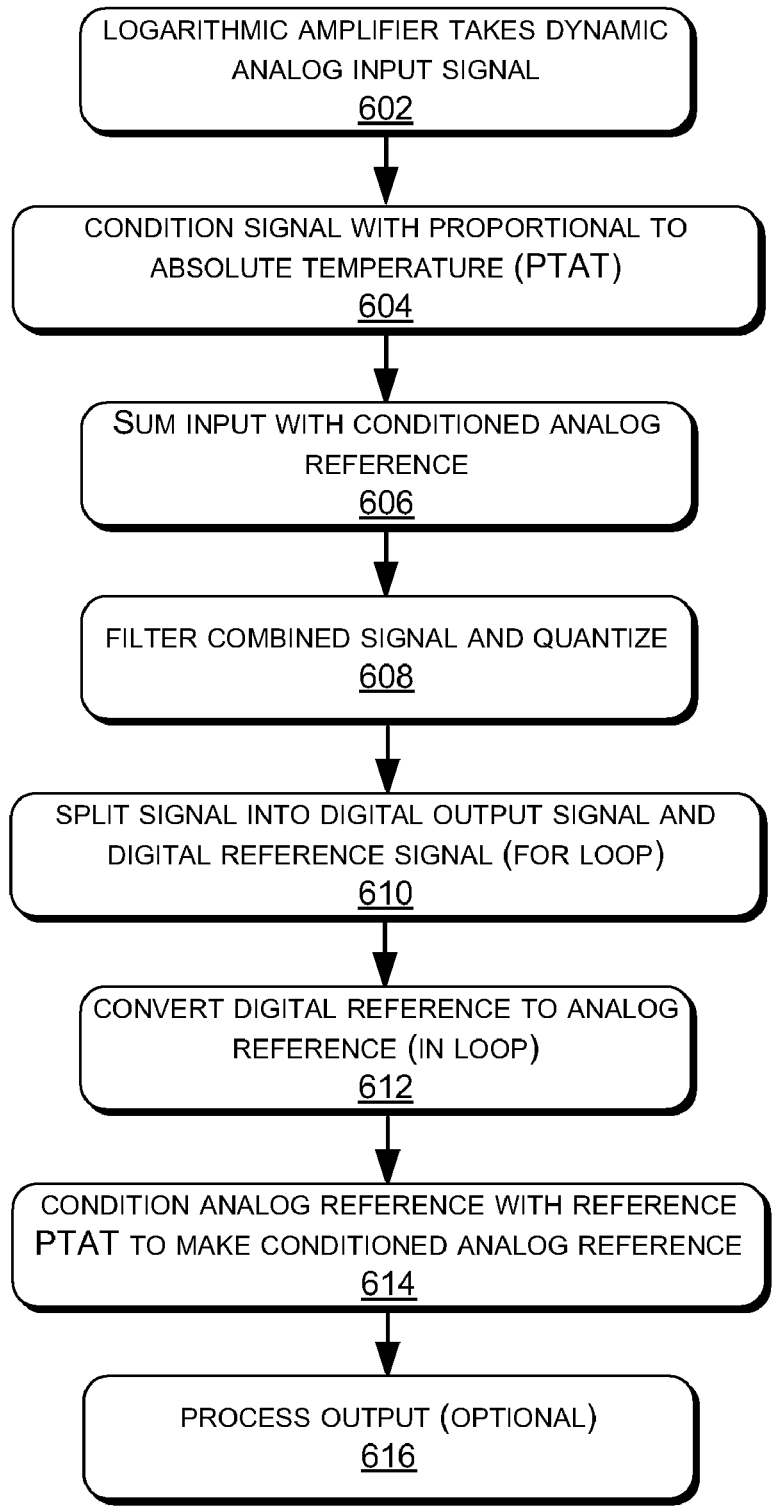
FIG. 6 is a flow diagram showing a method to operate a delta sigma modulator so as to make the output relatively temperature independent.

FIG. 6 is a flow diagram which shows a method to operate a ΔΣ modulator so as to make the output relatively temperature independent. A logarithmic amplifier takes a dynamic analog input signal 602 which is subjected to a PTAT conditioner 604 and summed with a conditioned analog reference 606. The combined signal is filtered and quantized 608. The signal is split into a digital reference signal and a digital output signal 610. The digital reference signal is converted into an analog reference signal 612. The analog reference signal is treated by a reference PTAT and becomes a conditioned analog reference 614. The output of the quantizer or system component(s) can be further processed 616, which is optional.

For simplicity, a first order ΔΣ modulator is illustrated herein. Other implementations are possible. In ΔΣ converters or modulators, the following are factors which contribute to a dynamic range: the order of the loop (the number of integrators), the number of levels of the quantizer, and the oversample ratio. Depending on the behavior desired, a ΔΣ modulator could be at least second order because the resulting signal to noise ratio can be better. Second order ΔΣ modulators are relatively stable and can incorporate the process described herein. A PTAT would be installed at each reference signal prior to the reference signal being combined at each summation element.

CONCLUSION

In the previous description, the implementations were described with reference to acts and symbolic representations of operations that are performed by one or more electronic components unless indicated otherwise. Although the description above uses language that is specific to structural features and methodological acts, it is to be understood that the implementations defined in the appended claims is not limited to the specific elements, features, modes, or acts described. Rather, the specifics are disclosed as exemplary forms. Therefore, the description herein contemplates all such implementations as may come within the scope of the following claims and equivalents thereof.

For the purposes of this disclosure and the claims that follow, terms such as "coupled," "connected," and "in electronic communication with" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

I claim:

1. A delta sigma modulator comprising:
    a first proportional to absolute temperature (PTAT) component between an input terminal and a summation element, the input terminal to receive an analog input signal; and
    a second PTAT component between a digital-to-analog converter and the summation element.

2. The delta sigma modulator of claim 1 further comprising a metal-oxide semiconductor (MOS) transistor or any other active device used to obtain a PTAT analog reference.

3. The delta sigma modulator of claim 1 wherein the delta sigma modulator is a first order or greater than first order delta sigma modulator.

4. The delta sigma modulator of claim 1, wherein the digital-to-analog converter is a single-bit digital-to-analog converter that is part of a reference loop, the single-bit digital-to-analog converter coupled to the second PTAT.

5. The delta sigma modulator of claim 1, wherein the digital-to-analog converter is a multi-bit digital-to-analog converter as that is part of a reference loop, the multi-bit digital-to-analog converter coupled to the second PTAT.

6. A wireless communication device including the delta sigma modulator of claim 1.

7. An electronic device for reducing the effect of temperature changes in a delta sigma modulator, the electronic device comprising:
    a logarithmic conditioner configured to receive a dynamic input;
    a first proportional to absolute temperature (PTAT) conditioner in electronic communication with the logarithmic conditioner;
    a summation element in electronic communication with the first PTAT conditioner, wherein the summation element sums the output of the first PTAT conditioner and a conditioned reference signal;
    an analog loop filter configured to receive an output of the summation element;
    a quantizer in electronic communication with the analog loop filter and which provides a digital signal;
    a digital to analog converter (DAC) in electronic communication with the quantizer, the DAC accepting the digital signal and providing a reference voltage signal; and
    a second PTAT in electronic communication with the DAC and the summation element, wherein the second PTAT forms the conditioned reference signal, wherein the summation element, analog loop filter, quantizer, and DAC form a loop, and wherein the quantizer provides an output signal of the delta sigma modulator.

8. The electronic device of claim 7 further comprising at least one digital signal processing element in electronic communication with the quantizer.

9. The electronic device of claim 7 wherein the conditioned reference signal is obtained with the use of a metal-oxide semiconductor (MOS) transistor.

10. The electronic device of claim 7 wherein the DAC is either single-bit or multi-bit, and wherein the quantizer is either single-bit or multi-bit.

11. A method of conditioning an analog input signal in a delta sigma modulator system, the method comprising:
    processing the analog input signal using a first proportional to absolute temperature (PTAT) conditioner to obtain a PTAT output signal;
    summing the PTAT output signal with a conditioned reference signal to obtain a summed signal;
    passing the summed signal output by the summation component through a loop filter and a quantizer, wherein the quantizer is configured to receive an output signal from the loop filter to obtain a quantized signal;
    converting the quantized signal into an analog feedback signal using a digital to analog converter (DAC);
    conditioning the analog feedback signal using a second PTAT conditioner to obtain the conditioned reference signal; and processing the quantized signal to provide an output signal for the delta sigma modulator system.

12. The method of claim 11 wherein processing the quantized signal comprises processing the quantized signal using a decimation filter to provide a decimation output signal.

13. The method of claim 12 wherein processing the quantized signal comprises processing the decimated output signal with at least one digital signal processor (DSP) to obtain a DSP output signal.

14. The method of claim 12 wherein processing the quantized signal comprises processing the decimated output signal with a look up table.

15. The method of claim 11 further comprising amplifying the analog input signal using a logarithmic amplifier prior to processing the analog input signal through the first PTAT conditioner.

16. A method of conditioning an analog signal, the method comprising:
    processing the analog signal using a first proportional to absolute temperature (PTAT) conditioner to obtain a PTAT output signal;
    providing a conditioned reference signal using a second PTAT;
    summing the PTAT output signal with the conditioned reference signal to obtain a summed signal; and
    providing an output signal of a delta sigma modulator system based on the summed signal, a voltage level of the output signal of the delta sigma modulator system remaining constant over variations in temperature.

17. The method of claim 16, further comprising:
    processing the summed signal through a loop filter and a quantizer, wherein the quantizer is configured to receive an output signal from the loop filter to obtain a quantized signal; and
    converting the quantized signal into an analog feedback signal using a digital to analog converter (DAC); wherein
    providing the conditioned reference signal using the second PTAT comprises conditioning the analog feedback signal.

18. The method of claim 17, further comprising:
    processing the quantized signal to provide the output signal for the delta sigma modulator system.

19. The method of claim 18, wherein
    processing the quantized signal to provide the output signal for the delta sigma modulator system comprises using a decimation filter to provide a decimated output signal and processing the decimated output signal with at least one digital signal processor (DSP) to obtain the output signal for the delta sigma modulator system.

* * * * *